(12) United States Patent
Haneda et al.

(10) Patent No.: US 8,370,564 B2
(45) Date of Patent: Feb. 5, 2013

(54) ACCESS CONTROL DEVICE, INFORMATION PROCESSING DEVICE, ACCESS CONTROL PROGRAM AND ACCESS CONTROL METHOD

(75) Inventors: Terumasa Haneda, Kawasaki (JP); Yoko Kawano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 257 days.

(21) Appl. No.: 12/707,161

(22) Filed: Feb. 17, 2010

(65) Prior Publication Data

US 2010/0228930 A1 Sep. 9, 2010

(30) Foreign Application Priority Data

Mar. 3, 2009 (JP) ................................. 2009-049826

(51) Int. Cl.
*G06F 13/10* (2006.01)
(52) U.S. Cl. ........................................................ 711/103
(58) Field of Classification Search .......................... None
See application file for complete search history.

(56) References Cited

U.S. PATENT DOCUMENTS

| 2001/0038554 | A1 | 11/2001 | Takata et al. | |
| 2005/0172065 | A1* | 8/2005 | Keays | 711/103 |
| 2007/0150649 | A1 | 6/2007 | Asari et al. | |
| 2007/0214310 | A1 | 9/2007 | Ishimoto et al. | |
| 2007/0245070 | A1* | 10/2007 | Mitsunaga | 711/103 |

FOREIGN PATENT DOCUMENTS

| JP | 2001-291394 | 10/2001 |
| JP | 2004-265162 | 9/2004 |
| JP | 2007-241896 | 9/2007 |
| JP | 2008-204114 | 9/2008 |
| WO | WO 2005/066974 A1 | 7/2005 |

OTHER PUBLICATIONS

Office Action mailed from the Japanese Patent Office on Jan. 18, 2011 in the corresponding Japanese patent application No. 2009-049826.

* cited by examiner

*Primary Examiner* — Duc Doan
(74) *Attorney, Agent, or Firm* — Staas & Halsey LLP (57) ABSTRACT

An access control device which writes data to each of predetermined storage block sets in a storage device of which a storage area has been divided into a plurality of storage blocks. The control device includes a management information storage section and an access processing section. The management information storage section stores, for each of said storage blocks, record enable/disable information indicating whether said storage block is a non-defective block in which the data can be recorded or a defective block in which the data cannot be recorded. If the data is written to each of said storage block sets, the access processing section writes the data only to non-defective blocks in said storage block set based on the record enable/disable information stored in said management information storage section.

10 Claims, 11 Drawing Sheets

| GROUP | RECORD ENABLE/DISABLE INFORMATION ||||||||| GROUP IDENTIFIED FLAG FOR WRITING DUMMY DATA |
| | Bank0 |||| Bank1 |||| |
| | Die0 || Die1 || Die0 || Die1 || |
| | BIT0 | BIT1 | BIT2 | BIT3 | BIT4 | BIT5 | BIT6 | BIT7 | |
|---|---|---|---|---|---|---|---|---|---|
| GROUP#1 | ENABLE | DISABLE | DISABLE | DISABLE | ENABLE | DISABLE | DISABLE | ENABLE | - |
| GROUP#2 | DISABLE | ENABLE | DISABLE | ENABLE | ENABLE | DISABLE | ENABLE | DISABLE | - |
| GROUP#3 | ENABLE | DISABLE | ENABLE | ENABLE | ENABLE | ENABLE | ENABLE | ENABLE | - |
| GROUP#4 | DISABLE | ENABLE | ENABLE | DISABLE | DISABLE | ENABLE | ENABLE | DISABLE | - |
| GROUP#5 | ENABLE | ENABLE | ENABLE | ENABLE | ENABLE | ENABLE | ENABLE | ENABLE | ○ |

FIG.5

| Bit | DEFINITION |
|---|---|
| [21:20] | Bank NUMBER |
| [19] | Die NUMBER |
| [18:08] | Block NUMBER |
| [07:02] | Page NUMBER |

FIG.9
RELATED ART
GROUPING

FIG.10
RELATED ART

| GROUP | WRITE ENABLE/DISABLE INFORMATION |
|---|---|
| GROUP#1 | ENABLE |
| GROUP#2 | DISABLE |
| ... | ... |
| GROUP#K | DISABLE |

FIG.11
RELATED ART

ACCESS CONTROL DEVICE, INFORMATION PROCESSING DEVICE, ACCESS CONTROL PROGRAM AND ACCESS CONTROL METHOD

CROSS-REFERENCE TO RELATED APPLICATIONS

This application is based upon and claims the benefit of priority of the prior Japanese Patent Application No. 2009-49826, filed on Mar. 3, 2009, the entire contents of which are incorporated herein by reference.

BACKGROUND

1. Field

Various embodiments described herein relate to an access control device, an information processing device, an access control program and an access control method.

2. Description of the Related Art

Conventionally, a nonvolatile memory such as a flash memory, which is provided in an information processing device, includes a plurality of banks in which a plurality of memory blocks formed in units of predetermined memory cells have been arrayed. For example, as illustrated in FIG. 9, in a nonvolatile memory 700, N+1 banks (Bank0 to BankN) having the plurality of memory blocks are provided horizontally in a row.

More specifically, in each bank, two dies, that is, Die0 and Die1 are provided horizontally in a row. In each die, M+2 memory blocks, that is, Block0 to BlockM+1, and two SRAMs (Static Random Access Memories), that is, SRAM0 and SRAM1 are provided. Block0 to BlockM+1 are arranged vertically in two columns (a column of Block0, Block2, . . . BlockM, and a column of Block1, Block3, . . . BlockM+1) on each die. Moreover, SRAM0 temporarily stores data to be written to the memory blocks belonging to the column of Block0, Block2, . . . BlockM (a column of even numbers), and SRAM1 temporarily stores data to be written to the memory blocks belonging to the column of Block1, Block3, . . . BlockM+1 (a column of odd numbers). In addition, each memory block has L+1 memory cells referred to as "pages" (page0 to pageL) which have been divided in units of a plurality of bits.

When data is written to the nonvolatile memory 700 as described above, the information processing device sets a combination of particular memory blocks existing in the respective banks, as one group, and writes the data to a plurality of the memory blocks in each group at a time. Specifically, the information processing device sets a combination of memory blocks, each of which is located at the same position in an order from a beginning of each memory block column, as one group.

Figure 9:
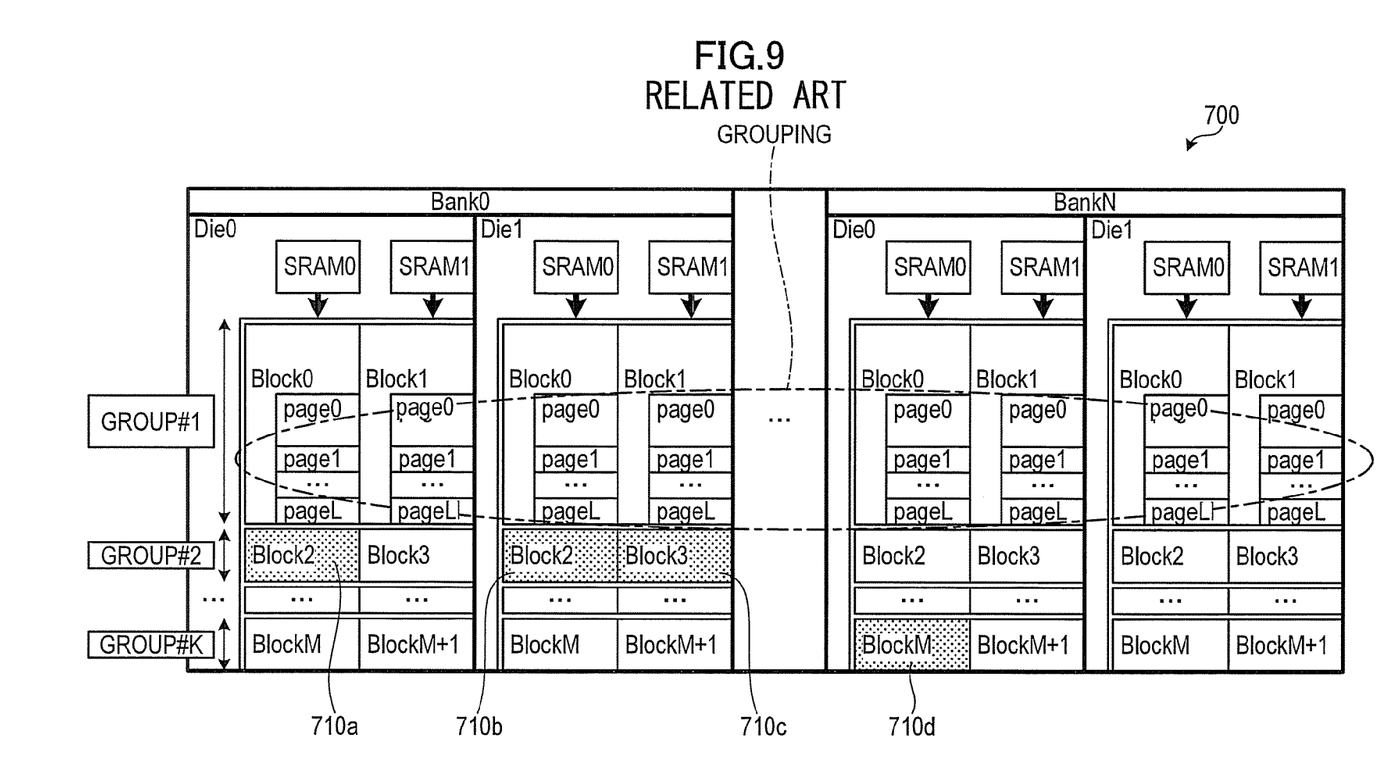
FIG. 9 is a diagram illustrating an example of a memory configuration of a conventional nonvolatile memory.

For example, as illustrated in FIG. 9, the information processing device sets a combination of memory blocks, each of which is located at the beginning of each memory block column, (Block0 and Block1 in each die) as one group, and writes the data to the plurality of memory blocks belonging to the above described group, at a time. In this way, the information processing device attempts to improve processing speed by writing the data to each bank in parallel. It should be noted that the groups included in the nonvolatile memory 700 are a group #1 to a group #K, respectively, in the order from the beginning of each memory block column.

Incidentally, a defective block may exist in the nonvolatile memory. The defective block is a memory block including a memory cell in which the data cannot be recorded. Some defective blocks have already existed since shipment from a factory. In addition, some good blocks have degraded due to repeated use and have become the defective blocks.

In a conventional nonvolatile memory, even if only one defective block exists in the same group, the data is not written to all the memory blocks in the group including the above described defective block, in order to maintain write performance. For example, as illustrated in FIG. 9, it is assumed that hatched memory blocks 710a to 710d, that is, Block2 in Die0 of Bank0 (the memory block 710a), Block2 in Die1 of Bank0 (the memory block 710b), Block3 in Die1 of Bank0 (the memory block 710c), and BlockM in Die0 of BankN (the memory block 710d) are the defective blocks. In this case, the information processing device does not write the data to the group including the memory blocks 710a to 710c and the group including the memory block 710d.

Figure 10:
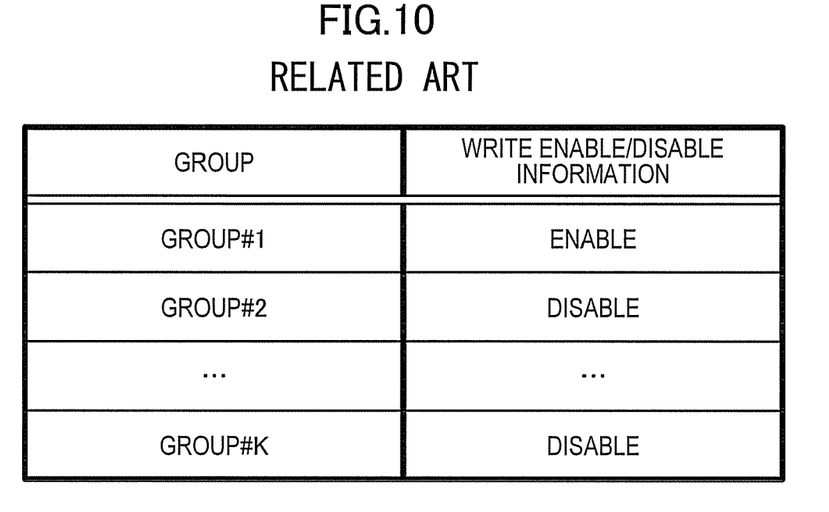
FIG. 10 is a diagram illustrating an example of a conventional memory management table.

It should be noted that the information processing device manages whether or not the data can be written to each group, in a memory management table. As illustrated in FIG. 10, the memory management table stores, for each of the group #1 to the group #K included in the nonvolatile memory 700, write enable/disable information indicating whether or not the data can be written to the above described group (that is, whether or not the above described group includes the defective block). For example, since the group #K includes the defective block 710d (see FIG. 9), as the write enable/disable information corresponding to the group #K, "disable" indicating that the data cannot be written to the above described group is stored in the memory management table. When the information processing device writes the data, the information processing device decides the group to which the data is written, with reference to this memory management table.

As described above, if the data is not written to all the memory blocks in the group including the defective block, the good block belonging to the above described group also cannot be used, which thus causes a problem of a reduced storage capacity which can be practically used. In other words, in such a case as illustrated in FIG. 9, the data cannot be written to BlockM, Block3 and BlockM+1 in Die0 of Bank0, BlockM and BlockM+1 in Die1 of Bank0, Block2, Block3 and BlockM+1 in Die0 of BankN, as well as Block2, Block3, BlockM and BlockM+1 in Die1 of BankN, which are the good blocks.

Figure 11:
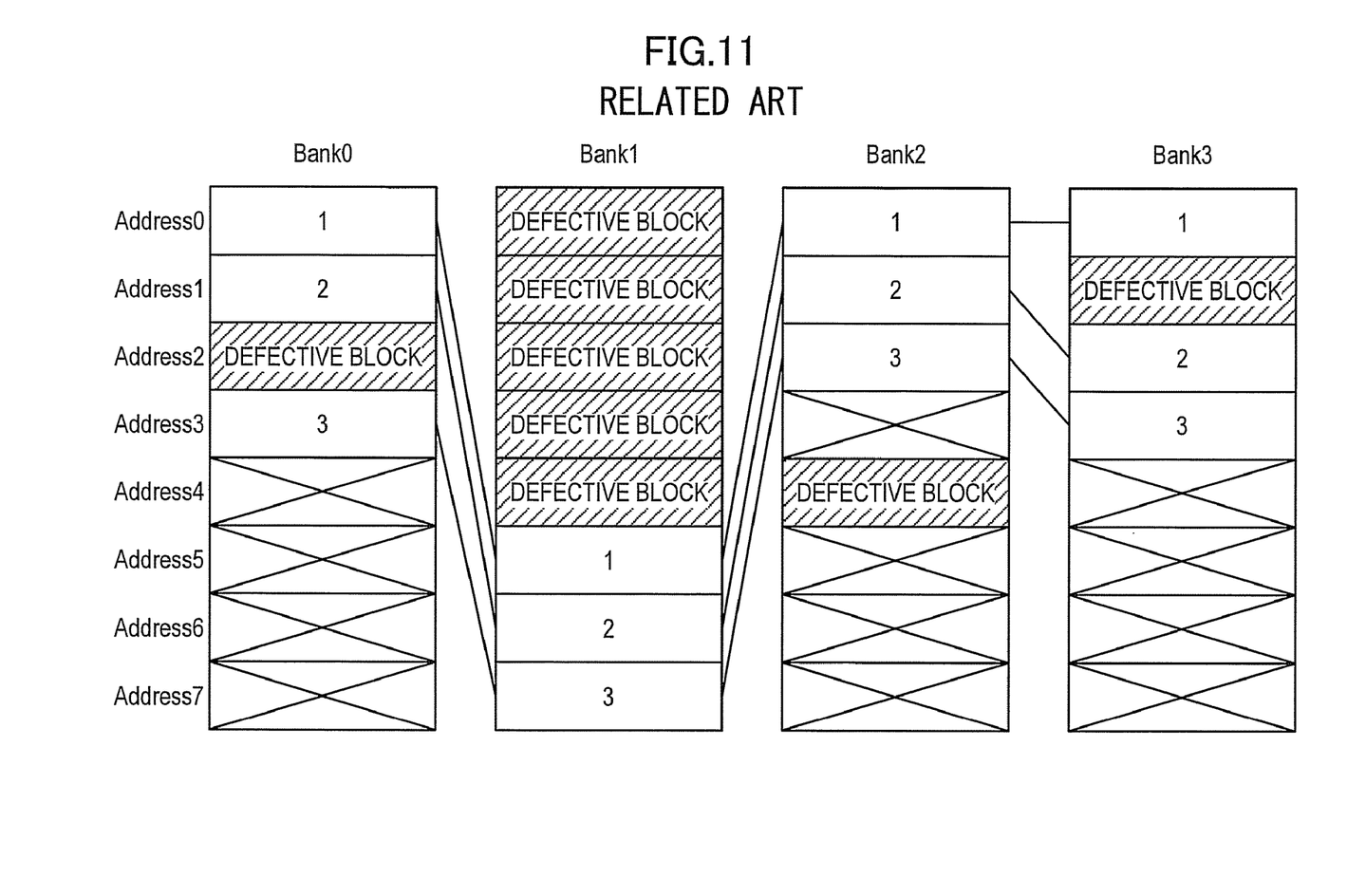
FIG. 11 is a diagram for explaining an access control method described in Japanese Patent Laid-Open No. 2004-265162.

In order to solve the above problem, for example, an access control method for effectively using the good blocks in the nonvolatile memory has been disclosed in Japanese Patent Laid-Open No. 2004-265162. Specifically, as illustrated in FIG. 11, each one of memory blocks belonging to each of a plurality of banks (Bank0 to Bank3) is selected while the defective block is avoided, and the selected memory blocks are grouped. In other words, if the defective block is included in the memory blocks belonging to the same address of the respective banks (that is, in a conventional group), another memory block belonging to the same bank as that of the above described defective block (that is, the memory block belonging to another group) is used instead of the above described defective block.

For example, as illustrated in FIG. 11, in a group consisting of the memory blocks located in Address0 of the respective banks, it is assumed that the memory block located in Address0 of Bank1 is the defective block. Instead of the defective block located in Address0 of Bank1, the memory block located in Address5 of Bank1 is used to write the data. In other words, the memory block in Address0 of Bank0, the memory block in Address5 of Bank1, the memory block in Address0 of Bank2, and the memory block in Address0 of Bank3 (memory blocks attached with a number "1" in FIG.

11) are set as one group. In this way, while the data is simultaneously written to all the banks similarly to conventional techniques, the good block to which the writing cannot be performed in the conventional nonvolatile memory can be used.

However, in the access control method disclosed in Japanese Patent Laid-Open No. 2004-265162, when the data is written, the data is simultaneously written to all the banks. Therefore, for example, if the defective blocks are concentrated in one bank, the good block may not be able to be effectively used. For example, as illustrated in FIG. 11, each bank has eight memory blocks denoted as Address0 to Address7, respectively. Among them, it is assumed that one defective block exists in each of Bank0, Bank2 and Bank3, while five defective blocks exist in Bank1.

In such a case, when the data is written, seven good blocks to which the writing can be performed exist in each of Bank0, Bank2 and Bank3, while only three good blocks are left in Bank1. Therefore, only three groups can be generated. Thus, four of the seven good blocks existing in each of Bank0, Bank2 and Bank3 (the memory blocks in Address4 to Address7 of Bank0, the memory blocks in Address3 and Address5 to Address7 of Bank2, and the memory blocks in Address4 to Address7 of Bank3) become the good blocks to which the data cannot be written.

SUMMARY

An access control device which writes data to each of predetermined storage block sets in a storage device of which a storage area has been divided into a plurality of storage blocks. The control device includes a management information storage section and an access processing section. The management information storage section stores, for each of said storage blocks, record enable/disable information indicating whether said storage block is a non-defective block in which the data can be recorded or a defective block in which the data cannot be recorded. If the data is written to each of said storage block sets, the access processing section writes the data only to non-defective blocks in said storage block set based on the record enable/disable information stored in said management information storage section.

The object and advantages of the various embodiments will be realized and attained by means of the elements and combinations particularly pointed out in the claims. It is to be understood that both the foregoing general description and the following detailed description are exemplary and explanatory and are not restrictive of the various embodiments, as claimed.

DETAILED DESCRIPTION OF THE EMBODIMENTS

Hereinafter, various embodiments of an access control device, an information processing device, an access control program and an access control method will be described in detail based on the drawings. It should be noted that, in the following embodiments, a case where a flash memory which is a nonvolatile memory is used as a storage device will be described. However, a technique disclosed in the present application is also effective, for example, for a volatile memory such as a DRAM (Dynamic Random Access Memory) and a disk device such as an HDD (Hard Disk Drive).

The access control method according to the present embodiment first temporarily stores data in a plurality of SRAMs in the flash memory. Next, if the data is written in parallel from each SRAM to a plurality of memory blocks in the above described flash memory, dummy data is temporarily stored in an SRAM corresponding to a defective block. Memory usage efficiency in a case where the defective block exists can be increased by writing the dummy data read from the SRAM, to a block other than the defective block.

Figure 1:
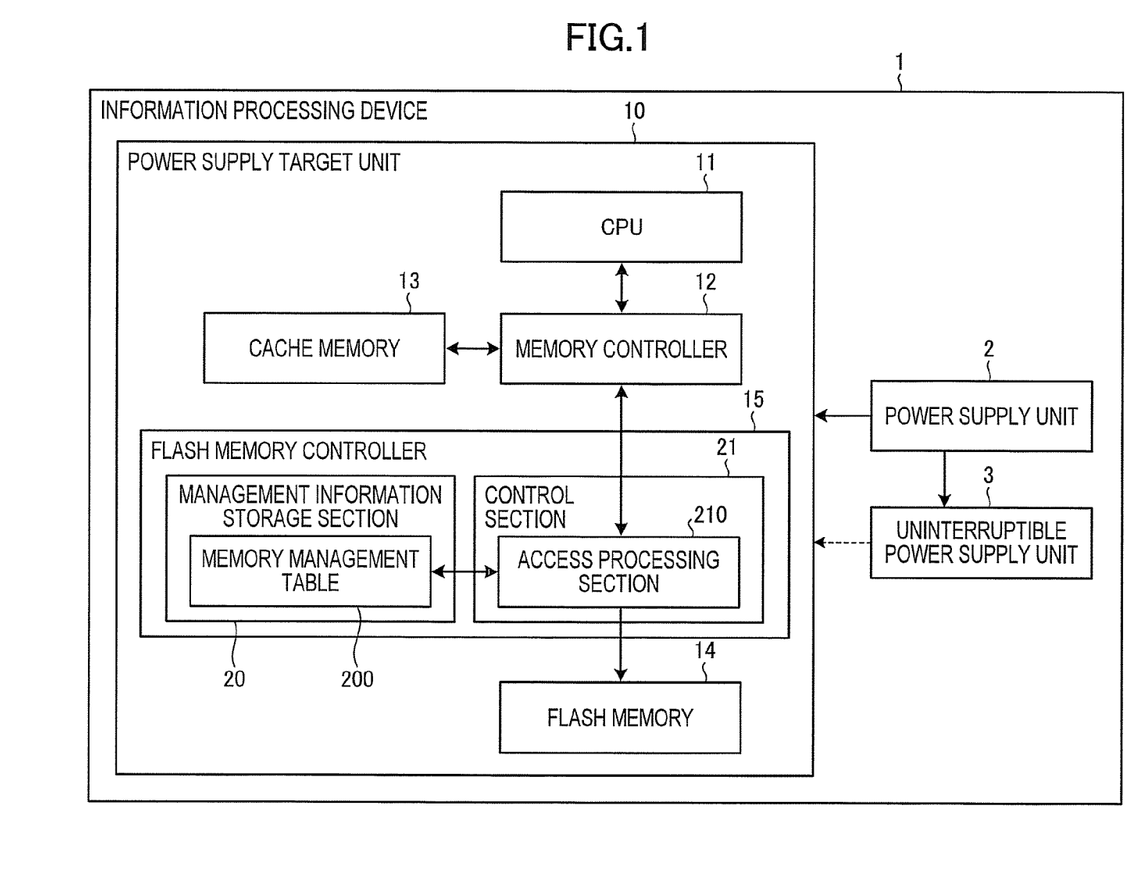
FIG. 1 is a block diagram illustrating a configuration of an information processing device in an embodiment.
Figure 2:
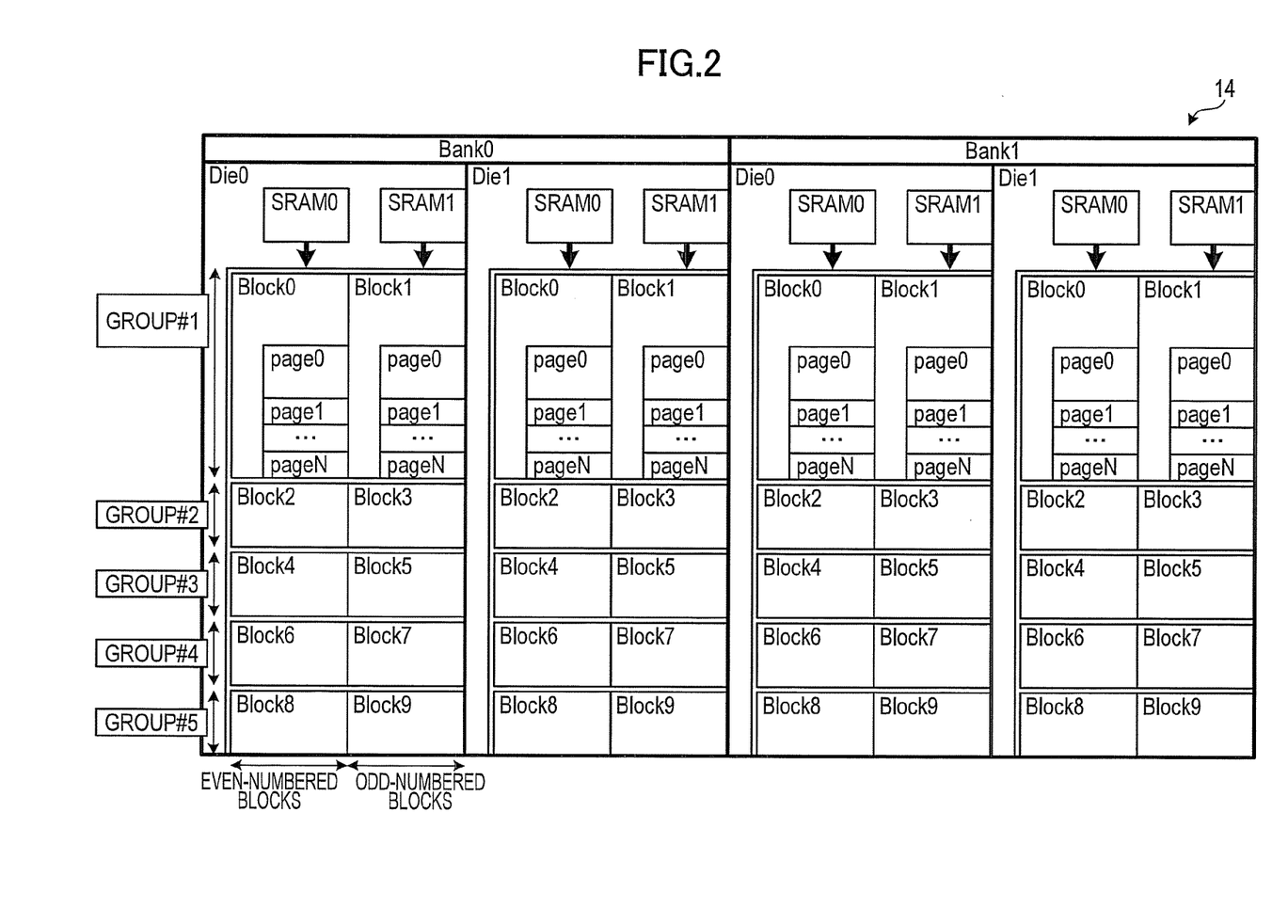
FIG. 2 is a diagram illustrating an example of a memory configuration of a flash memory in the embodiment.
Figure 3:
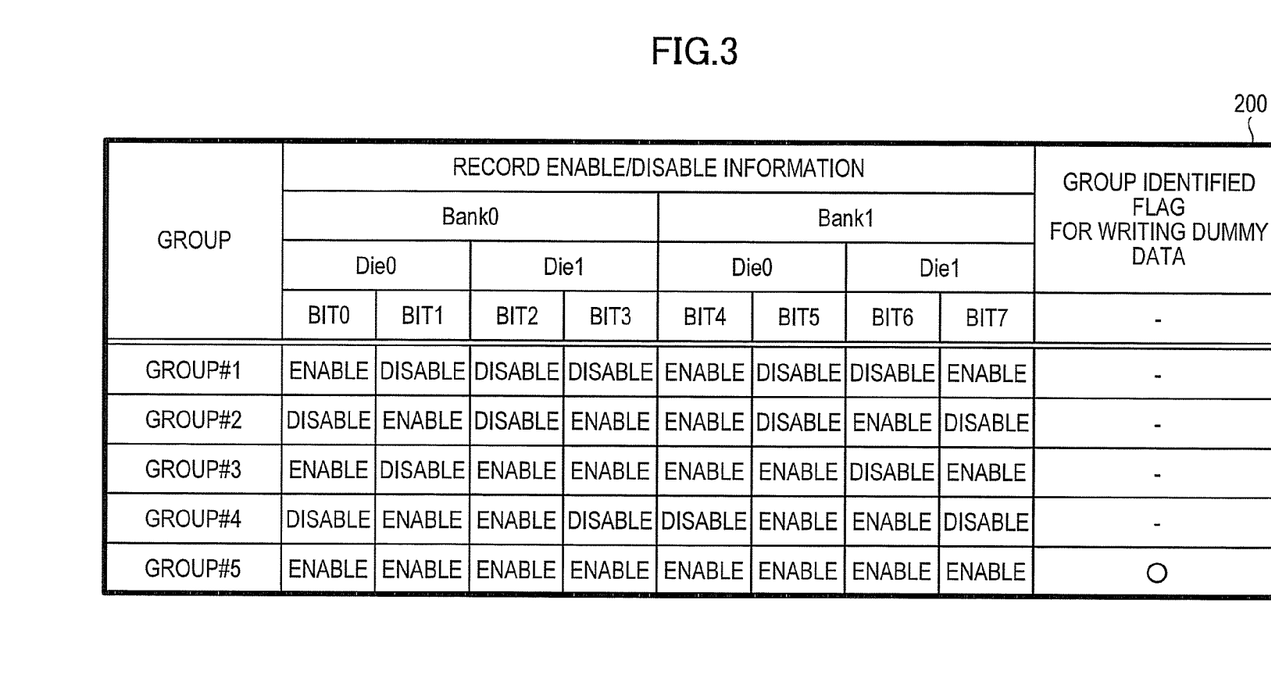
FIG. 3 is a diagram illustrating an example of a memory management table in the embodiment.

First, a configuration of the information processing device according to the present embodiment will be described with reference to the drawings. FIG. 1 is a block diagram illustrating the configuration of the information processing device in an embodiment. FIG. 2 is a diagram illustrating an example of a memory configuration of the flash memory in the embodiment. FIG. 3 is a diagram illustrating an example of a memory management table in the embodiment. It should be noted that, in the present embodiment, as an example of the information processing device, there will be described an information processing device which has a function of using power supplied from an uninterruptible power supply unit to save data from a cache memory into the flash memory upon power failure. However, the technique disclosed in the present application is also applicable to an information processing device not having such a function.

As illustrated in FIG. 1, an information processing device 1 according to the present embodiment includes a power supply unit 2, an uninterruptible power supply unit 3, and a power supply target unit 10. The power supply unit 2 usually supplies power to the power supply target unit 10. The uninterruptible power supply unit 3 is a high-capacity capacitor, battery or the like which supplies power to the power supply target unit 10 if the power is not supplied from the power supply unit 2 due to the power failure.

The power supply target unit 10 includes a CPU (Central Processing Unit) 11, a memory controller 12, a cache memory 13, a flash memory 14, and a flash memory controller 15. The CPU 11 is an arithmetic processing unit which performs calculation and processing for data stored in the cache memory 13 or the flash memory 14.

The memory controller 12 is a device which controls accesses from the CPU 11 to the cache memory 13. Moreover, the memory controller 12 is connected to the flash memory controller 15 via a bus such as a PCI-X or PCIe bus, and passes a data write request or a data read request which is from the CPU 11 to the flash memory 14, to the flash memory controller 15. Particularly, the memory controller 12 according to the present embodiment uses the power from the uninterruptible power supply unit 3 to perform a process for writing the data stored in the cache memory 13, to the flash memory 14, upon the power failure. Thereby, loss of the data which has been temporarily retained in the cache memory that is a volatile memory can be prevented.

The cache memory 13 is a volatile memory such as a DDR SDRAM (Double Data Rate Synchronous DRAM), and for example, temporarily retains data to be written to the flash memory 14. The flash memory 14 as the storage device is a nonvolatile memory which stores various data. The flash memory 14 includes a plurality of banks in which a plurality of memory blocks (corresponding to storage blocks) formed in units of predetermined memory cells have been arrayed. Specifically, in the flash memory 14, as illustrated in FIG. 2, two banks (Bank0 and Bank1) including the plurality of memory blocks are provided horizontally in a row. Moreover, in each bank, two dies (Die0 and Die1) are provided horizontally in a row, and in each die, 10 memory blocks (Block0 to Block9) and two SRAMs (SRAM0 and SRAM1) are provided. In this way, in the flash memory 14 according to the present embodiment, a storage area has been divided into the plurality of memory blocks. It should be noted that FIG. 2 illustrates a logical configuration of the flash memory 14, and the banks or the dies do not necessarily need to be physically arranged horizontally in a row.

Block0 to Block9 are arranged vertically in two columns (a column of Block0, Block2, . . . Block8, and a column of Block1, Block3, . . . Block9) on each die. Moreover, SRAM0 temporarily stores data to be written to the memory blocks belonging to the column of Block0, Block2, . . . Block8 (hereinafter, referred to as "even-numbered blocks"), and SRAM1 temporarily stores data to be written to the memory blocks belonging to the column of Block1, Block3, . . . Block9 (hereinafter, referred to as "odd-numbered blocks"). In addition, each memory block includes N+1 memory cells referred to as "pages" (page0 to pageN) which have been divided in units of a plurality of bits. It should be noted that the even-numbered blocks or the odd-numbered blocks also do not necessarily need to be physically arranged vertically in a column, similarly to the banks or the dies.

In the present embodiment, the information processing device 1 sets a combination of particular memory blocks existing in the respective banks, as one group. Here, "a combination of particular memory blocks" means a combination of memory blocks, each of which exists at the same position in each memory block column. For example, as illustrated in FIG. 2, if it is assumed that a beginning of each memory block column is at an SRAM side, a combination of memory blocks, each of which is located at the above described beginning, (Block0 and Block1 existing in each die) is set as one group. Hereinafter, the group including Block0 and Block1 is a group #1, the group including Block2 and Block3 is a group #2, the group including Block4 and Block5 is a group #3, the group including Block6 and Block7 is a group #4, and the group including Block8 and Block9 is a group #5.

In this way, the data can be efficiently written to the flash memory 14 by grouping a combination of memory blocks to which the data is written from different SRAMs. The above described point will be described later.

The flash memory controller 15 as the access control device controls accesses to the flash memory 14 if the data stored in the cache memory 13 is written to the flash memory 14 or the data is read from the flash memory 14 based on the data read request from the memory controller 12. The flash memory controller 15 includes a management information storage section 20 and a control section 21. The management information storage section 20 stores information required for controlling the accesses to the flash memory 14. Particularly, the management information storage section 20 has a memory management table 200.

As illustrated in FIG. 3, the memory management table 200 stores, for each of all the memory blocks included in the flash memory 14, record enable/disable information indicating whether the above described memory block is a good block in which the data can be recorded or the defective block in which the data cannot be recorded. For example, a field of a column of the even-numbered blocks in Die0 of Bank0 and a row of the group #3 is a field which stores the record enable/disable information regarding Block4 in Die0 of Bank0 in FIG. 2, and stores "enable" indicating that the above described memory block is the good block. Similarly, a field of a column of the odd-numbered blocks in Die0 of Bank1 and a row of the group #2 is a field which stores the record enable/disable information regarding Block3 in Die0 of Bank1 in FIG. 2, and stores "disable" indicating that the above described memory block is the defective block.

Moreover, the memory management table 200 stores a group identification flag for writing dummy data. Here, a group for writing the dummy data is a group to which a memory block, to which the dummy data to be described later is written, belongs, and will be described in detail later. A group in which this group identification flag for writing dummy data has been set becomes the group for writing the dummy data.

The control section 21 controls the entire flash memory controller 15. The control section 21 has an access processing section 210. It should be noted that the control section 21 according to the present embodiment is a DMA engine which performs data transfer by DMA (Direct Memory Access).

The access processing section 210 controls a process for writing the data to the flash memory 14 and a process for reading the data from the flash memory 14. Here, if the data is written to the flash memory 14, the access processing section 210 sets groups (the groups #1 to #5) of the memory blocks as predetermined memory block sets (corresponding to storage block sets), and writes the data for each group.

Specifically, before writing the data to the flash memory controller 15, the access processing section 210 writes the data to be written to each memory block, to the SRAM corresponding to each memory block. For example, data to be written to Block0 in Die0 of Bank0 is written to SRAM0 in Die0 of Bank0 before being written to the above described memory block. Then, when all the data to be written to the memory blocks included in one group is written to the SRAMs corresponding to the respective memory blocks, the access processing section 210 writes the data stored in each SRAM, to the memory blocks corresponding to each SRAM, all together.

In this way, if the data is written, the access processing section 210 stores the data to be written to the memory blocks belonging to one group, in the SRAMs corresponding to the respective memory blocks, and subsequently, writes the data from the SRAMs to these memory blocks at a time. Thereby, data writing speed can be increased. It should be noted that, hereinafter, an operation of writing the data stored in the SRAM, to the memory block, may be referred to as "programming".

Figure 4:
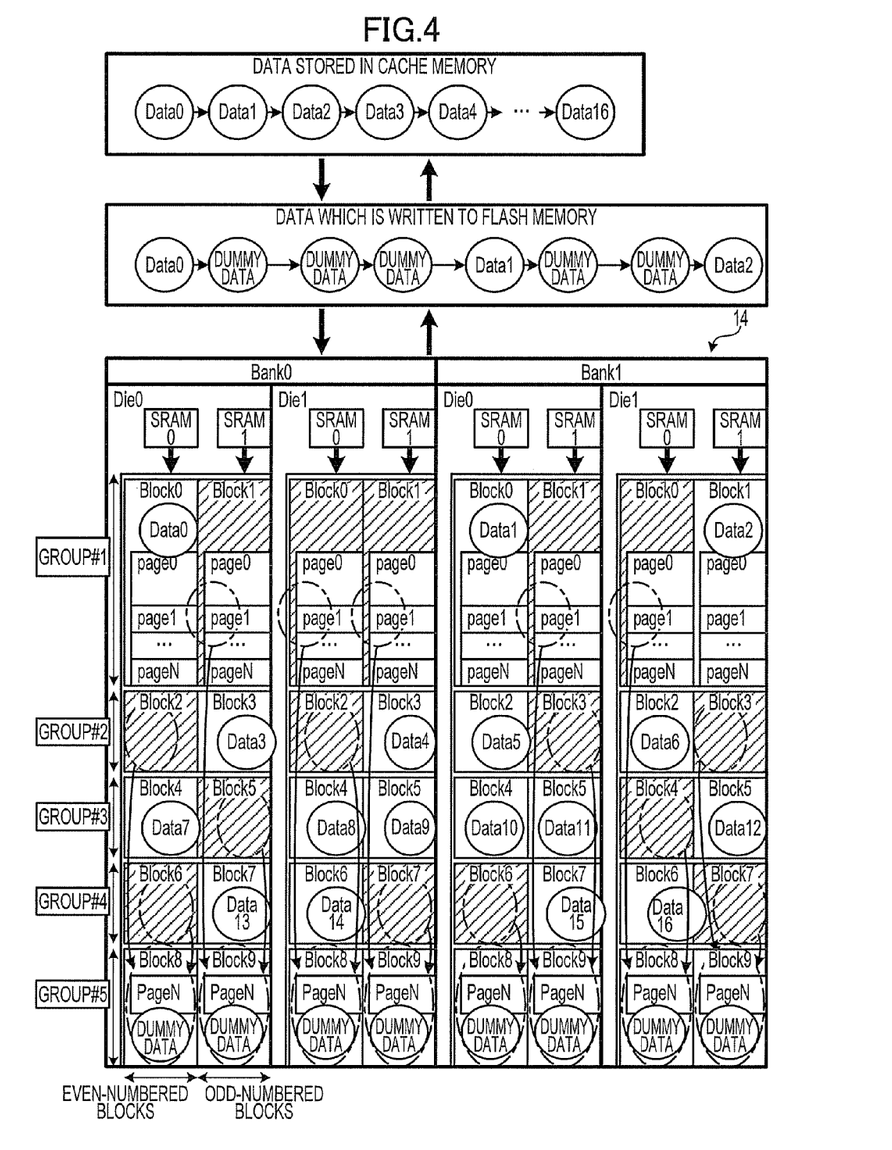
FIG. 4 is a diagram for explaining an access control method in the embodiment.
Figure 5:
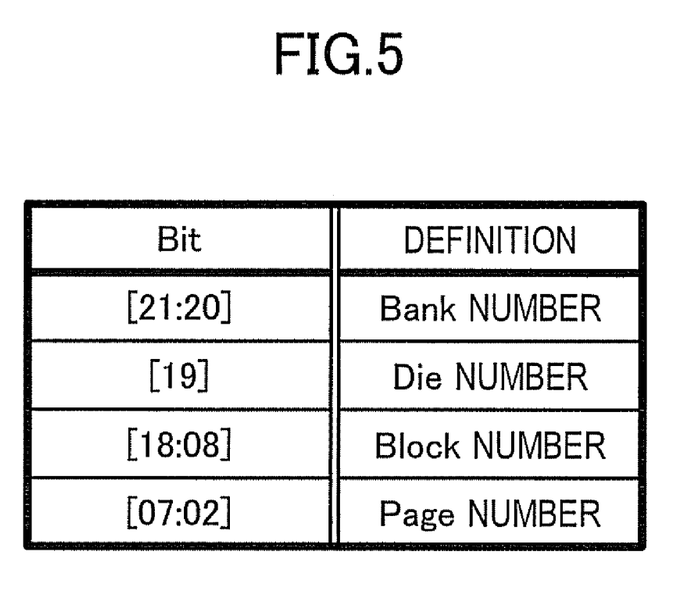
FIG. 5 is an image diagram of a memory address in the embodiment.

Particularly, if the data is written to each group, the access processing section 210 according to the present embodiment writes the data only to the good blocks included in the above described group, based on the record enable/disable information stored in the memory management table 200. Hereinafter, the access control method according to the present embodiment will be specifically described with reference to the drawings. FIG. 4 is a diagram for explaining the access control method in the present embodiment. FIG. 5 is an image diagram of a memory address in the embodiment.

For example, as illustrated in FIG. 4, it is assumed that Data0 to Data16 have been stored in the cache memory 13 as the data to be written to the flash memory 14. If these pieces of data are written in units of groups in order from the group #1, the access processing section 210 first determines whether or not the memory blocks belonging to the group #1 are the good blocks, based on the memory management table 200. As a result thereof, among the memory blocks belonging to the group #1, if it is determined that Block0 in Die0 of Bank0, Block0 in Die0 of Bank1, and Block1 in Die1 of Bank1 are the good blocks, the access processing section 210 writes Data0, Data1 and Data2 to these three memory blocks, respectively. In other words, the data is not written to Block1 in Die0 of Bank0, Block0 in Die1 of Bank0, Block1 in Die1 of Bank0, Block1 in Die0 of Bank1, and Block0 in Die1 of Bank1, which are the defective blocks in the group #1 (hatched memory blocks in FIG. 4).

Incidentally, as described above, if the data is written to the flash memory 14, the access processing section 210 according to the present embodiment uses all the SRAMs on the flash memory 14 to simultaneously write the data to the memory blocks. Thus, even if the data is written only to the good blocks, an access to the defective block also occurs when the programming is performed. In order to deal with such a situation, the access processing section 210 according to the present embodiment performs a process for writing the dummy data to the SRAM corresponding to the above described defective block.

However, for example, if the memory block to which the data is attempted to be written has degraded due to repeated use and has become the defective block, and the data has failed to be written, the access processing section 210 performs a process for transferring and writing the data which has failed to be written, to another memory block. Thus, if the dummy data has been written to the defective block, a wasteful process for transferring and writing the dummy data to another memory block occurs. Consequently, in the present embodiment, when the data is written to the flash memory 14, in order to prevent occurrence of the writing from the SRAM to the defective block, the SRAM corresponding to the defective block does not write the dummy data to the defective block, but writes the dummy data to the good block corresponding to the above described defective block.

Specifically, when the data to be written to the flash memory 14 (for example, Data0 to Data16) is stored in each SRAM, the access processing section 210 writes proper data (any of Data0 to Data16) to the SRAM corresponding to the good block, while writing the dummy data to the SRAM corresponding to the defective block.

Then, when the data stored in each SRAM is written to the respective corresponding memory blocks at a time, the access processing section 210 writes the proper data to the good block, and writes the dummy data to another memory block corresponding to the defective block. Here, another memory block corresponding to the defective block is the good block corresponding to the same SRAM as that of the defective block.

More specifically, in the present embodiment, among the groups #1 to #5 of the memory blocks existing in the flash memory 14, at least one of the groups in which all the memory blocks are the good blocks is set as the group for writing the dummy data. Therefore, in the present embodiment, as illustrated in FIG. 3, the group #5 becomes the group for writing the dummy data. Moreover, the memory blocks belonging to the group #5 (Block8 in Die0 of Bank0, Block9 in Die0 of Bank0, Block8 in Die1 of Bank0, Block9 in Die1 of Bank0, Block8 in Die0 of Bank1, Block9 in Die0 of Bank1, Block8 in Die1 of Bank1, and Block9 in Die1 of Bank1) become the memory blocks for writing the dummy data.

Here, the access processing section 210 discriminates which group is the group for writing the dummy data, with reference to the group identification flag for writing dummy data stored in the memory management table 200. For example, as illustrated in FIG. 3, if the group identification flag for writing dummy data has been set in a field corresponding to the group #5, the access processing section 210 discriminates that the group #5 is the group for writing the dummy data.

Then, if the dummy data is written from the SRAM to the flash memory 14, the access processing section 210 writes the dummy data to the memory block which corresponds to the above described SRAM and belongs to the group for writing the dummy data. For example, if a process for writing the data to the group #1 is performed, the dummy data stored in SRAM1 in Die0 of Bank0 is written to Block9 in Die0 of Bank0, instead of Block1 in Die0 of Bank0. Moreover, if a process for writing the data to the group #3 is performed, similarly, the dummy data stored in SRAM1 in Die0 of Bank0 is written to Block9 in Die0 of Bank0, instead of Block5 in Die0 of Bank0.

In this way, if the data is written to one group, the access processing section 210 according to the present embodiment writes the proper data to the good block belonging to the above described group, and writes the dummy data to the memory block which corresponds to the defective block in the above described group and belongs to the group for writing the dummy data. For example, if the process for writing the data to the group #1 is performed, the access processing section 210 writes Data0 to Data2, which is the proper data, to Block0 in Die0 of Bank0, Block0 in Die0 of Bank1, and Block1 in Die1 of Bank1, respectively, and also writes the dummy data to Block9 in Die0 of Bank0, Block8 in Die1 of Bank0, Block9 in Die1 of Bank0, Block9 in Die0 of Bank1, and Block8 in Die1 of Bank1, respectively.

Here, a state where no data has been written to the memory block indicates a state where "1" has been written to the above described memory block. In addition, the writing of the data to the above described memory block is performed by rewriting information "1" written to the above described memory block, to "0". Moreover, if another data is written to the memory block to which the data has already been written, the data stored in the above described memory block is erased once and the state of the above described memory block is changed to "1" (this process is referred to as "erasing process"), and subsequently, "0" is written to the above described memory block. This erasing process is the most common cause of the degradation in the memory block. The data (dummy data) is more frequently written to the memory block for writing the dummy data, in comparison with other memory blocks. Thus, if the erasing process is performed each time the writing is performed, the memory block for writing the dummy data may degrade soon and become the defective block, and may not function as the memory block for writing the dummy data.

Consequently, in the present embodiment, the access processing section 210 writes "1" as the dummy data to the memory block belonging to the group for the dummy data. In this way, since the memory block for writing the dummy data is overwritten with "1" as the dummy data, the erasing process does not need to be performed each time the dummy data is written. Therefore, the degradation in the memory block for writing the dummy data can be prevented.

Moreover, if the data is read from the flash memory 14, the access processing section 210 reads the data from each memory block, based on the record enable/disable information stored in the memory management table 200. Specifically, with reference to the record enable/disable information on each memory block, if the above described memory block is the good block, the access processing section 210 reads the data stored in the above described memory block. On the other hand, if the memory block is the defective block, the data is not read.

It should be noted that, if the flash memory 14 is accessed, the access processing section 210 designates the memory block to which the data is to be written, by the memory address, and stores this memory address along with the data in the SRAM. Here, as illustrated in FIG. 5, the memory address includes a Page number (address: bits 02 to 07), a Block number (address: bits 08 to 18), a Die number (address: bit 19), and a Bank number (address: bits 20 and 21). Then, the SRAM writes the stored data to the memory block designated by the memory address.

Figure 6:
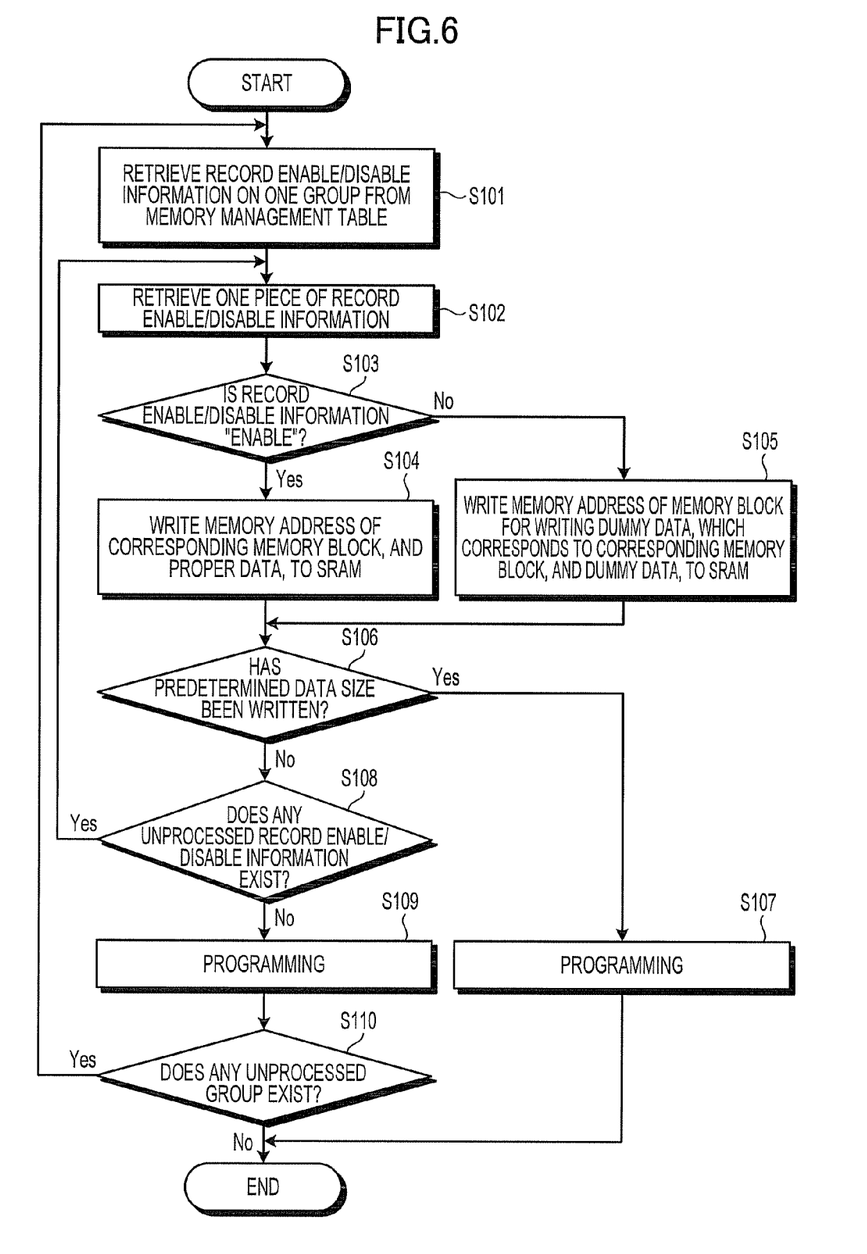
FIG. 6 is a flowchart illustrating a processing procedure of a data writing process in the embodiment.

Next, specific operations of the information processing device 1 according to the present embodiment will be described with reference to the drawings. First, a data writing process according to the present embodiment will be described. FIG. 6 is a flowchart illustrating a processing procedure of the data writing process in the embodiment.

As illustrated in FIG. 6, when the data writing process is started, the access processing section 210 retrieves the record enable/disable information on one group from the memory management table 200 (step S101). Specifically, the access processing section 210 retrieves the record enable/disable information in units of groups, in an order in which the writing of the data is performed. In other words, as illustrated in FIG. 3, the access processing section 210 retrieves eight pieces of the record enable/disable information included in each group, in an order of the group #1, the group #2, the group #3, the group #4 and then the group #5.

Subsequently, the access processing section 210 retrieves one piece of the record enable/disable information from a plurality of pieces of the record enable/disable information retrieved in step S101 (step S102). Specifically, the access processing section 210 retrieves one piece of the record enable/disable information from the retrieved eight pieces of the record enable/disable information, in the order in which the writing of the data is performed. For example, if the eight pieces of the record enable/disable information included in the group #1 have been retrieved in step S101, the access processing section 210 first retrieves the record enable/disable information corresponding to the even-numbered block in Die0 of Bank0, from these eight pieces of the record enable/disable information.

Subsequently, the access processing section 210 determines whether or not the record enable/disable information retrieved in step S102 is "enable" (step S103). It should be noted that, in the memory management table 200, "0" is stored in the corresponding field if the memory block is the good block (in a case of "enable"), and "1" is stored in the corresponding field if the memory block is the defective block (in a case of "disable"). Then, if the retrieved record enable/disable information is "0", the access processing section 210 determines that the above described record enable/disable information is "enable".

In this process, if it is determined that the retrieved record enable/disable information is "enable" (Yes in step S103), the access processing section 210 writes the memory address of the memory block corresponding to the above described record enable/disable information, and the proper data, to the SRAM corresponding to the above described memory block (step S104).

For example, it is assumed that the record enable/disable information retrieved in step S102 is the record enable/disable information corresponding to the even-numbered block in Die0 of Bank0, and the above described record enable/disable information is "enable" as illustrated in FIG. 3. In this case, the access processing section 210 writes the memory address of Block0 in Die0 of Bank0, which is the memory block corresponding to the above described record enable/disable information, and the proper data to be written to the above described memory block (for example, "Data0" illustrated in FIG. 4), to SRAM0 in Die0 of Bank0 corresponding to the above described memory block.

On the other hand, if the record enable/disable information retrieved in step S102 is not "enable" (No in step S103), the access processing section 210 writes the memory address of the memory block for writing the dummy data, which corresponds to the corresponding memory block, and the dummy data, to the SRAM corresponding to the above described memory block (step S105).

For example, it is assumed that the record enable/disable information retrieved in step S102 is the record enable/disable information corresponding to the odd-numbered block in Die0 of Bank0, and the above described record enable/disable information is "disable" as illustrated in FIG. 3. In this case, the access processing section 210 writes the memory address of the memory block for writing the dummy data (Block9 in Die0 of Bank0), which corresponds to the corresponding memory block (Block1 in Die0 of Bank0), and the dummy data, to SRAM1 in Die0 of Bank0 corresponding to the above described memory block (Block9 in Die0 of Bank0).

Subsequently, the access processing section 210 determines whether or not a predetermined data size has been written (step S106). Specifically, the access processing section 210 determines whether or not all the data to be written to the flash memory 14 (for example, Data0 to Data16) has been stored in the SRAMs.

More specifically, if the data write request has been received, based on a data size of data to be written in response to the above described request, the access processing section 210 calculates the number of blocks of the storage blocks to which the above described data is written (hereinafter, referred to as "the number of blocks to which the writing is performed"). Then, the access processing section 210 stores the calculated number of blocks to which the writing is performed, in a predetermined storage area. Moreover, the access processing section 210 counts the number of times in which it has been determined that the record enable/disable information retrieved in step S102 is "enable", and stores the counted number in the predetermined storage area.

Then, if the above described counted number and the number of blocks to which the writing is performed, which have been stored in the predetermined storage area, are identical with each other, the access processing section 210 determines that the predetermined data size has been written. For example, if the number of blocks to which the writing is performed, which has been calculated based on the data size of the data to be written in response to the write request, has been 17, when the counted number of times in which it has been determined that the record enable/disable information retrieved in step S102 is "enable" reaches 17, the access processing section 210 determines that the predetermined data size has been written. It should be noted that the number of blocks to which the writing is performed is updated by the access processing section 210 each time the write request is received.

In this process, if it has been determined that the predetermined data size has been written (Yes in step S106), the access processing section 210 performs the programming (step S107). In other words, the access processing section 210 writes the proper data or the dummy data stored in each SRAM to the corresponding memory blocks at a time. On this occasion, each SRAM writes the proper data or the dummy data to the memory block designated by the memory address. It should be noted that the access processing section 210 discriminates which group is the group for writing the dummy data, with reference to the group identification flag for writing dummy data stored in the memory management table 200.

On the other hand, when the predetermined data size has not been written in step S106 (No in step S106), the access processing section 210 moves the process to step S108. In step S108, the access processing section 210 determines whether or not any unprocessed record enable/disable information exists. Specifically, the access processing section 210 determines whether or not any record enable/disable information for which the process in steps S103 to S106 has not been performed exists among the eight pieces of the record enable/disable information retrieved in step S101. In this process, if it is determined that the unprocessed record enable/disable information exists (Yes in step S108), the access processing section 210 moves the process to step S102, and retrieves the record enable/disable information corresponding to the memory block to which the data is to be written next.

On the other hand, if no unprocessed record enable/disable information exists (No in step S108), the access processing section 210 moves the process to step S109. It should be noted that a case where no unprocessed record enable/disable information exists is, in other words, a case where the proper data or the dummy data has been recorded to all the SRAMs on the flash memory 14.

In step S109, the access processing section 210 performs the programming. In other words, the access processing section 210 writes the proper data or the dummy data stored in each SRAM to the corresponding memory blocks at a time. On this occasion, each SRAM writes the proper data or the dummy data to the memory block designated by the memory address.

Subsequently, the access processing section 210 determines whether or not any unprocessed group exists (step S110). In other words, the access processing section 210 determines whether or not any group on which the record enable/disable information has not yet been retrieved from the memory management table 200 exists. In this process, if it has been determined that the unprocessed group exists (Yes in step S110), the access processing section 210 moves the process to step S101, and retrieves the record enable/disable information on the group to which the data is to be written next. On the other hand, if no unprocessed group exists in step S110 (No in step S110), or if the process in step S107 has been terminated, the access processing section 210 terminates the data writing process.

Figure 7:
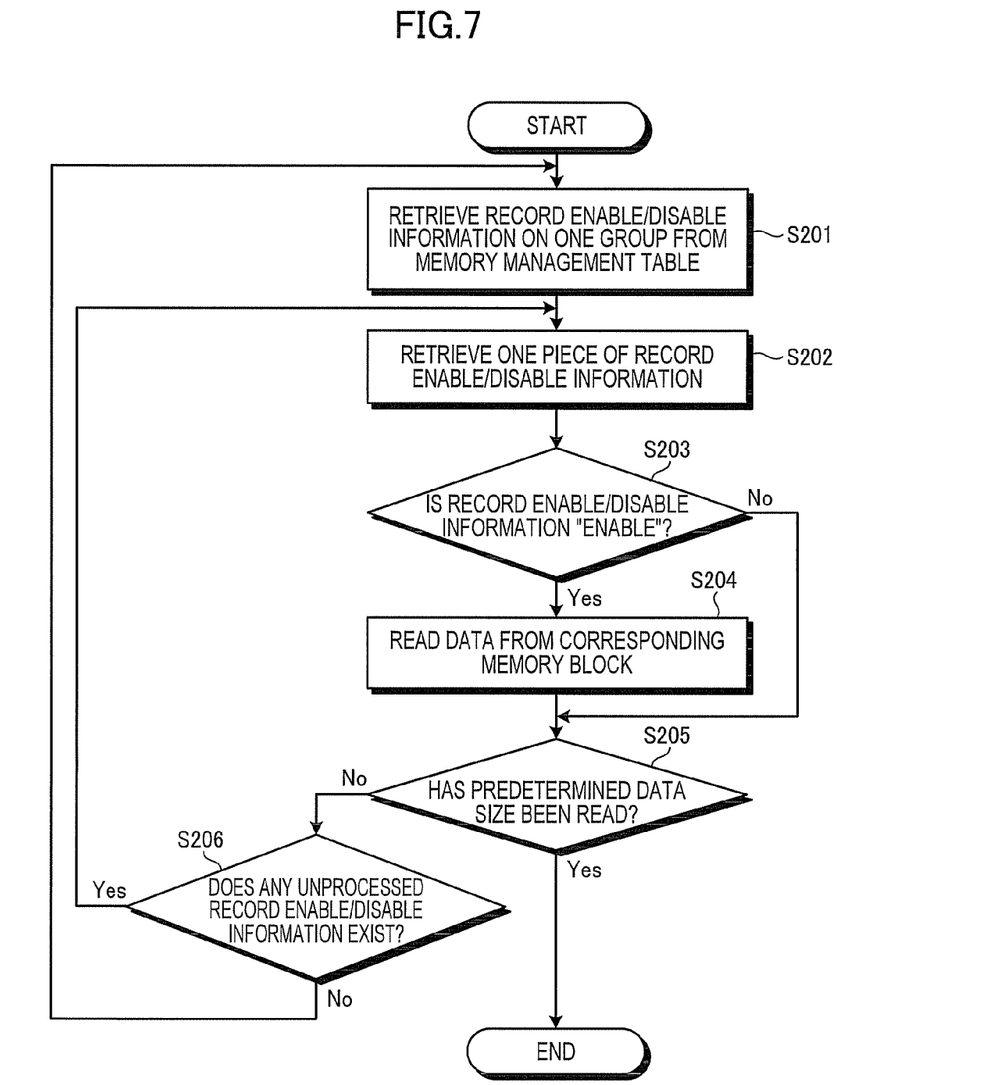
FIG. 7 is a flowchart illustrating a processing procedure of a data reading process in the embodiment.

Subsequently, a data reading process according to the present embodiment will be described. FIG. 7 is a flowchart illustrating a processing procedure of the data reading process in the embodiment.

As illustrated in FIG. 7, when the data reading process is started, the access processing section 210 retrieves the record enable/disable information on one group from the memory management table 200 (step S201). Specifically, the access processing section 210 retrieves the record enable/disable information in units of groups, in an order in which the reading of the data is performed. Subsequently, the access processing section 210 retrieves one piece of the record enable/disable information from a plurality of pieces of the record enable/disable information retrieved in step S201 (step S202). Specifically, the access processing section 210 retrieves one piece of the record enable/disable information from the retrieved eight pieces of the record enable/disable information, in the order in which the reading of the data is performed.

Subsequently, the access processing section 210 determines whether or not the record enable/disable information retrieved in step S202 is "enable" (step S203). In this process, if it is determined that the retrieved record enable/disable information is "enable" (Yes in step S203), the access processing section 210 reads the data stored in the memory block corresponding to the above described record enable/disable information (step S204). When the process in step S204 has been terminated, or if the record enable/disable information retrieved in step S202 is not "enable" (No in step S203), the access processing section 210 determines whether or not a predetermined data size has been read (step S205).

Specifically, the access processing section 210 determines whether or not all the data to be read from the flash memory 14 (for example, Data0 to Data16) has been read. More specifically, if the data read request has been received, the access processing section 210 stores the number of blocks of the storage blocks in which the data to be read in response to the above described request has been stored (hereinafter, referred to as "the number of blocks from which the reading is performed"), in a predetermined storage area. Moreover, the access processing section 210 counts the number of times in which it has been determined that the record enable/disable information retrieved in step S202 is "enable", and stores the counted number in the predetermined storage area.

Then, if the above described counted number and the number of blocks from which the reading is performed, which have been stored in the predetermined storage area, are identical with each other, the access processing section 210 determines that the predetermined data size has been read. For example, if the number of blocks from which the reading is performed has been 17, when the counted number of times in which it has been determined that the record enable/disable information retrieved in step S202 is "enable" reaches 17, the access processing section 210 determines that the predetermined data size has been read. It should be noted that the number of blocks from which the reading is performed is updated by the access processing section 210 each time the read request is received.

In the process in step S205, when the predetermined data size has not been read (No in step S205), the access processing section 210 determines whether or not any unprocessed record enable/disable information exists (step S206). In this process, if it is determined that the unprocessed record enable/disable information exists (Yes in step S206), the access processing section 210 moves the process to step S202, and retrieves the record enable/disable information corresponding to the memory block from which the data is to be read next. On the other hand, if no unprocessed record enable/disable information exists (No in step S206), the access processing section 210 moves the process to step S201, and retrieves the record enable/disable information on the group from which the data is to be read next. On the other hand, if it is determined in step S205 that the predetermined data size has been read (Yes in step S205), the access processing section 210 terminates the data reading process.

Figure 8:
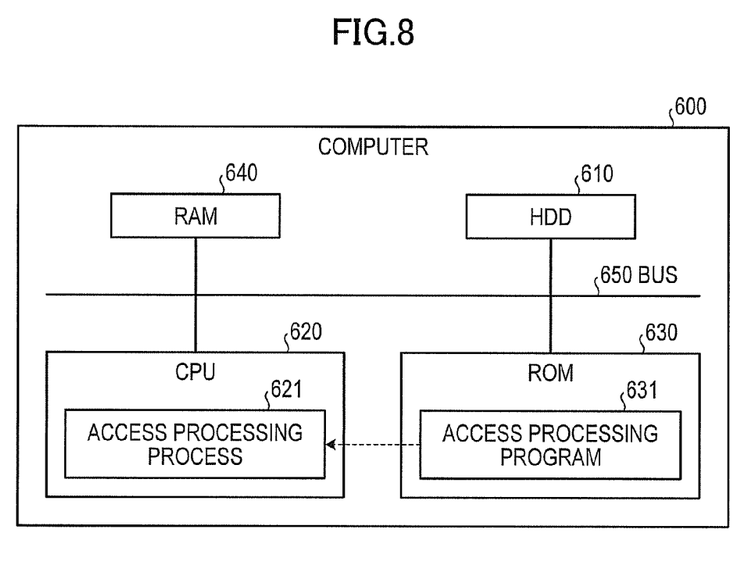
FIG. 8 is a diagram illustrating a computer which executes an access control program.

Incidentally, various processes described in the above described embodiment can be realized by executing a previously prepared program in a computer. Consequently, hereinafter, an example of a computer which executes an access control program having a function similar to the control section 21 illustrated in the above described embodiment will be described. FIG. 8 is a diagram illustrating the computer which executes the access control program.

As illustrated in FIG. 8, a computer 600 is configured in which an HDD 610, a CPU 620, a ROM 630 and a RAM 640 are connected via a bus 650.

In the ROM 630, the access control program which fulfills a function similar to the above described embodiment, that is, an access processing program 631 has been previously stored. Then, the access processing program 631 functions as an access processing process 621 by reading the access processing program 631 from the ROM 630 and executing the access processing program 631 by the CPU 620.

It should be noted that various data which is used by the access processing process 621 has been stored in the HDD 610. The CPU 620 reads the various data stored in the HDD 610, and stores the various data in the RAM 640. The access processing process 621 uses the various data stored in the RAM 640 to execute the various processes such as the data writing process.

As described above, in the present embodiment, for each memory block, the record enable/disable information indicating whether the above described memory block is the good block in which the data can be recorded, or the defective block in which the data cannot be recorded, is stored. Based on this record enable/disable information, the data is written only to the good blocks in the above described memory block set. Therefore, the good blocks in the nonvolatile memory can be used more effectively.

Moreover, for example, in the access control method disclosed in Japanese Patent Laid-Open No. 2004-265162, if any defective block is included in one group, a memory block which originally belongs to another group is used instead of the above described defective block, and the data is written at a time. Thus, if the data is read in order, it is necessary to specify which memory block the data to be written to the defective block has been written to, and the process may be cumbersome. On the other hand, according to the access control method according to the present embodiment, since the data is written only to the memory blocks belonging to one group at a time, the reading process may not be cumbersome.

Moreover, in the present embodiment, when the data is written to the group including the defective block, the dummy data is written to the memory block for writing the dummy data, which corresponds to the defective block included in the above described group. Thus, while improvement in the writing speed is attempted by writing the data all together in units of groups, the writing to the defective block is prevented, and thereby such a situation itself where the dummy data is rewritten to another memory block can be prevented. Moreover, an occurrence of an error due to the access to the defective block can also be prevented.

Moreover, in the present embodiment, the dummy data is set as "1". Thus, if the dummy data is written to the memory block for writing the dummy data, the memory block only has to be overwritten with "1", and the erasing process does not need to be performed. Therefore, the degradation in the memory block for writing the dummy data can be prevented.

According to one aspect of the access control device disclosed in the present application, there is provided an effect that the good blocks in the nonvolatile memory can be used more effectively.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An access control device that writes data to each of predetermined storage block sets in a storage device of which a storage area has been divided into a plurality of storage blocks, the control device comprising:
   a memory to store, for each of said storage blocks, record enable/disable information indicating whether said storage block is a non-defective block in which the data can be recorded or a defective block in which the data cannot be recorded; and
   a processor, when the data is written to each of said storage block sets, to write the data only to non-defective blocks in said storage block set, based on the record enable/disable information stored in the memory, wherein
   among a plurality of said storage block sets, the processor determines at least one of the storage block sets, in which all the storage blocks belonging thereto are non-defective blocks, as a first storage block set for writing dummy data, and
   when the data is written to a second storage block set including a defective block, the processor writes the data to non-defective blocks in the second storage block sets, and writes the dummy data to a storage block in the first storage block sets which corresponds to the defective block included in the second storage block set.

2. The access control device according to claim 1, wherein the processor writes 1 as said dummy data to the storage block belonging to the first storage block set for the dummy data.

3. An access control device that writes data to each of predetermined storage block sets in a storage device of which a storage area has been divided into a plurality of storage blocks, the control device comprising:
- a memory to store, for each of said storage blocks, record enable/disable information indicating whether said storage block is a non-defective block in which the data can be recorded or a defective block in which the data cannot be recorded; and
- a processor, when the data is written to each of said storage block sets, to write the data only to non-defective blocks in said storage block set, based on the record enable/disable information stored in said memory, wherein the processor stores the number of blocks to which the writing is performed, which is calculated based on a data size of data to be written in response to a write request, in a predetermined storage area,
- the processor stores the number of times in which it has been determined that said storage block is a non-defective block based on the record enable/disable information stored in the memory, in the predetermined storage area, and
- when said number of times in which it has been determined that the storage block is a non-defective block is identical with said number of blocks to which the writing is performed, the processor determines that all the data to be written in response to the write request has been written to the storage blocks.

4. The access control device according to claim 3, wherein said access processing section updates said number of blocks to which the writing is performed, each time said write request is received.

5. An information processing device, comprising:
- a storage device, having a storage area that has been divided into a plurality of storage blocks, that writes data to each of predetermined storage block sets in said storage device;
- a memory to store, for each of said storage blocks, record enable/disable information indicating whether said storage block is a non-defective block in which the data can be recorded or a defective block in which the data cannot be recorded; and
- a processor, when the data is written to each of said storage block sets, to write the data only to non-defective blocks in said storage block set, based on the record enable/disable information stored in the memory, wherein
- among a plurality of said storage block sets, said processor determines at least one of the storage block sets, in which all the storage blocks belonging thereto are non-defective blocks, as a first storage block set for writing dummy data, and
- when the data is written to a second storage block set including a defective block, the processor writes the data to non-defective blocks in the second storage block sets, and writes the dummy data to a storage block in the first storage block sets which corresponds to the defective block included in the second storage block set.

6. The information processing device according to claim 5, wherein the processor writes 1 as said dummy data to the storage block belonging to the first storage block set for the dummy data.

7. A computer-readable recording medium encoded with an access control program for writing data to each of predetermined storage block sets in a storage device of which a storage area has been divided into a plurality of storage blocks, the program containing instructions executable on a computer, the program causing the computer to execute:
- when the data is written to each of said storage block sets, recording record enable/disable information indicating whether each storage block included in said storage block set is a non-defective block in which the data can be recorded or a defective block in which the data cannot be recorded; and
- writing the data only to non-defective blocks in said storage block set, based on said record enable/disable information, wherein
- among a plurality of said storage block sets, determining at least one of the storage block sets, in which all the storage blocks belonging thereto are non-defective blocks, as a first storage block set for writing dummy data, and
- when the data is written to a second storage block set including a defective block, writing the data to non-defective blocks in the second storage block sets, and writing the dummy data to a storage block in the first storage block sets which corresponds to the defective block included in the second storage block set.

8. The computer-readable recording medium according to claim 7, wherein 1 is written as said dummy data to the storage block belonging to the first storage block set for the dummy data.

9. An access control method for writing data to each of predetermined storage block sets in a storage device of which a storage area has been divided into a plurality of storage blocks, the method comprising:
- when the data is written to each of said storage block sets, recording record enable/disable information indicating whether each storage block included in said storage block set is a non-defective block in which the data can be recorded or a defective block in which the data cannot be recorded; and
- writing the data only to non-defective blocks in said storage block set, based on said record enable/disable information, wherein
- among a plurality of said storage block sets, determining at least one of the storage block sets, in which all the storage blocks belonging thereto are non-defective blocks, as a first storage block set for writing dummy data, and
- when the data is written to a second storage block set including a defective block, writing the data to non-defective blocks in the second storage block sets, and writing the dummy data to a storage block in the first storage block sets which corresponds to the defective block included in the second storage block set.

10. The method according to claim 9, wherein 1 is written as said dummy data to the storage block belonging to the first storage block set for the dummy data.

* * * * *